US012738830B2

(12) United States Patent
Esteghlal

(10) Patent No.: US 12,738,830 B2
(45) Date of Patent: Sep. 15, 2026

(54) DC/DC CONVERTER WITH COMBINED CURRENT AND VOLTAGE REGULATION

(71) Applicant: Robert Bosch GmbH, Stuttgart (DE)

(72) Inventor: Gholamabas Esteghlal, Stuttgart-Weilimdorf (DE)

(73) Assignee: Robert Bosch GmbH, Stuttgart (DE)

( * ) Notice: Subject to any disclaimer, the term of this patent is extended or adjusted under 35 U.S.C. 154(b) by 203 days.

(21) Appl. No.: 18/851,273

(22) PCT Filed: Feb. 27, 2023

(86) PCT No.: PCT/EP2023/054808

§ 371 (c)(1),
(2) Date: Sep. 26, 2024

(87) PCT Pub. No.: WO2023/186423

PCT Pub. Date: Oct. 5, 2023

(65) Prior Publication Data

US 2026/0171885 A1 Jun. 18, 2026

(30) Foreign Application Priority Data

Apr. 1, 2022 (DE) ..................... 10 2022 203 234.9

(51) Int. Cl.

| | |
|---|---|
| ***H02M 1/00*** | (2007.01) |
| ***H02M 3/04*** | (2006.01) |
| ***H02M 3/156*** | (2006.01) |
| ***H02M 3/335*** | (2006.01) |
| ***H03K 7/08*** | (2006.01) |

(52) U.S. Cl.
CPC ..... *H02M 1/0009* (2021.05); *H02M 3/33507* (2013.01); *H03K 7/08* (2013.01); *H02M 3/04* (2013.01); *H02M 3/156* (2013.01)

(58) Field of Classification Search
CPC ....... H02M 1/0009; H02M 3/04; H02M 3/156
See application file for complete search history.

(56) References Cited

U.S. PATENT DOCUMENTS

| | | | | |
|---|---|---|---|---|
| 10,530,251 | B1 * | 1/2020 | Hoffmeister | H02M 3/157 |
| 2020/0186026 | A1 * | 6/2020 | Esteghlal | H02M 3/04 |

FOREIGN PATENT DOCUMENTS

| | | | |
|---|---|---|---|
| CN | 111585440 | A | 8/2020 |
| DE | 102009028147 | A1 | 2/2011 |
| DE | 102019213076 | A1 | 3/2021 |

(Continued)

OTHER PUBLICATIONS

Translation of International Search Report for Application No. PCT/EP2023/054808 dated Jun. 6, 2023 (3 pages).

(Continued)

*Primary Examiner* — Gary A Nash
(74) *Attorney, Agent, or Firm* — Michael Best & Friedrich LLP

(57) ABSTRACT

The invention relates to a DC-DC converter arrangement with at least one DC-DC converter, wherein the DC-DC converter comprises a current regulation and a voltage regulation. For the current regulation, a first component is provided hereby for regulation based on the primary-side current at the DC/DC converter, and a second component is provided for regulation based on the secondary-side current at the DC/DC converter.

8 Claims, 2 Drawing Sheets

(56) References Cited

FOREIGN PATENT DOCUMENTS

| | | | | |
|---|---|---|---|---|
| WO | WO-2021037540 A1 * | 3/2021 | .......... | H02M 1/0009 |
| WO | WO-2021037544 A1 * | 3/2021 | .......... | H02M 1/0025 |

OTHER PUBLICATIONS

Amrei et al., "High Power DC-DC Converters Under Large Load and Input Voltage Variations: A New Approach," International Power Engineering Conference, 2005, 6 pages.

Jiande et al., "Advanced Four-Pair Architecture with Input Current Balance Function for Power Over Ethernet (PoE) System," IEEE Transactions on Power Electronics, 2013, vol. 28, No. 5, pp. 2343-2355.

Zong et al., "Theoretical Evaluation of Stability Improvement Brought by Resonant Current Loop for Paralleled LLC Converters," IEEE Transactions on Industrial Electronics, 2015, vol. 62, No. 7, pp. 4170-4180.

* cited by examiner

DC/DC CONVERTER WITH COMBINED CURRENT AND VOLTAGE REGULATION

BACKGROUND

The present invention relates to a DC/DC converter apparatus and to a method for operating a DC/DC converter apparatus.

Fully or at least semi-electrically powered vehicles as a rule have an electrical energy store, for example a traction battery. This traction battery provides the electrical energy required in order to propel the electric vehicle. The traction battery as a rule supplies an output voltage of multiple hundreds of volts and supplies a so-called high-voltage network of the vehicle. Moreover, such a vehicle as a rule comprises multiple electrical consumers supplied at a lower electrical voltage via a low-voltage network. For coupling the high-voltage network and the low-voltage network, and in particular for transferring electrical energy from the high-voltage network to the low-voltage network, so-called DC/DC converter can be provided, which convert an electrical DC voltage from the high-voltage network into a DC voltage for the low-voltage network.

Publication DE 2009 028 147 A1 describes a circuit arrangement for an on-board electrical system of an electric vehicle, wherein a DC/DC converter is provided for coupling between two on-board electrical system parts.

SUMMARY

The present invention discloses a DC/DC converter apparatus and a method for operating a DC/DC converter apparatus with the features of the independent claims. Further advantageous embodiments are the subject-matter of the dependent claims.

The following is provided:

A DC/DC converter apparatus with at least one DC/DC converter and a control device. The at least one DC-DC converter is configured so as to convert an input DC voltage into an output DC voltage. The control device comprises a voltage control and a current control. The voltage control is configured so as to determine a first control variable for the DC/DC converter using a target value for the output voltage of the DC/DC converter and a measured value for the output voltage of the DC/DC converter. The current control comprises a first regulator device and a second regulator device. The first regulator device is configured so as to determine a first current control variable using an electrical current at the input of the DC-DC converter. The second regulator device is configured so as to determine a second current control variable using an electrical current at the output of the DC-DC converter. The current control is configured so as to determine a second control variable using the first current control variable and the second current control variable. Lastly, the control device is configured so as to actuate the DC-DC converter using a combination of the first control variable and the second control variable.

The following is furthermore provided:

A method for operating a DC-DC converter apparatus with at least one DC-DC converter. The method comprises a step of determining a first control variable using a target value for the output voltage of the DC-DC converter and a measured value for the output voltage of the DC-DC converter. Furthermore, the method comprises a step of determining a first current control variable using an electrical current at the input of the DC-DC converter. Moreover, the method comprises a step of determining a second current control variable using an electrical current at the output of the DC-DC converter, a step of determining a second control variable for the DC-DC converter using the first current control variable and the second current control variable, and a step of actuating the at least one DC-DC converter using a combination of the first control variable and the second control variable.

The present invention is based on the finding that, for a regulation of the DC-DC converter, the electrical current on the output or secondary side can be considered. In particular, when a transformer is provided in the DC-DC converter, then, for the calculation of the output current limit, a conversion must be carried out, considering the transformation ratio of the transformer. However, such a conversion requires some computational time, so that there can be delays in the regulation. Such delays can result in oscillations in the system.

It is therefore an idea of the present invention to consider this finding and to create a control structure for a DC-DC converter arrangement that comprises a robust control behavior. According to the present invention, two separate parts are provided in the control structure for the current regulation. In particular, a separate current regulation is provided for the input or primary-side current and for the output or secondary-side current. In this way, the sensed current values can be supplied directly to the respective control structures without having to carry out a computationally intensive conversion.

In particular, the electrical currents can be considered on the primary or input side as well as on the secondary or output side independently of one another for current regulation.

By such a control structure with separate current controls for the primary or input side as well as for the secondary or output side, the specifications, for example, for hardware protection, such as for the necessary current limits, can thus be implemented more easily. In particular, the sensor and component tolerances have less influence on the system behavior.

According to one embodiment, the current control is configured so as to select, as the second control variable, the lower of the first current control variable versus the second current control variable. In other words, the current control in each case selects as the control variable the minimum of the two current control variables, which in each case have been determined in relation to the primary or secondary side of the DC/DC converter. This ensures that the DC-DC converter is always operated below the maximum permitted current.

According to one embodiment, the first regulator device is configured so as to determine the first current control variable using a comparison of the electrical current at the input of the DC-DC converter with a predefined target value for the electrical current at the input of the DC-DC converter. Accordingly, the second regulator device can be configured so as to determine the second current control variable using a comparison of the electrical current at the output of the DC-DC converter with a predefined target value for the electrical current at the output of the DC-DC converter. Furthermore, in this case, the current control can be configured so as to determine the second control variable using the lower of the first current control variable versus the second current control variable. In this way, the current control can be implemented particularly simply and efficiently. According to one embodiment, the first regulator device and the second regulator device of the converter are in each case configured so as to output a control signal if the corresponding regulator device is active in an operating mode in which a maximum current in the DC/DC converter is limited. Hereby the voltage control is configured so as to adjust the first control variable using the control signal from the current control. In this way, it is possible to restrict or suspend the voltage regulation in the voltage control if the current regulation in the current control limits the DC/DC converter.

According to one embodiment, the DC-DC converter apparatus comprises multiple DC-DC converters. Thereby a separate current control is provided for each DC-DC converter of the DC-DC converter apparatus. Furthermore, a common voltage control is provided for all DC-DC converters of the DC-DC converter apparatus. In this way, the power of the DC-DC converter apparatus can be increased by a parallel switching of multiple DC-DC converters. The separate current regulation for each DC-DC converter allows the overall power to be easily distributed among the individual voltage controls.

According to one embodiment, the DC/DC converter comprises a flyback DC/DC converter. Because such flyback DC voltages comprise a transformer in their supersonic sounding, the transformation ratio of the transformers used hereby can be integrated into the current regulation in a simple and efficient manner through the separate current regulation for the primary/input side as well as the secondary/output side.

According to one embodiment, the control device is configured so as to output a duty cycle for a pulse width modulation as a control variable for actuating the DC/DC converter. This allows for a pulse width modulated (PWM) actuating of the DC/DC converters in a simple manner.

The above designs and further developments can be combined with one another in any desired manner, insofar as advantageous. Additional designs, further developments, and implementations of the invention can also include combinations of inventive feature not explicitly specified above or described hereinafter in relation to exemplary embodiments. The skilled person will in particular also add individual aspects as improvements or additions to the respective basic forms of the invention.

BRIEF DESCRIPTION OF THE DRAWINGS

Further features and advantages of the invention are explained hereinafter with reference to the drawings. Shown are.

In the drawings, identical reference numbers denote identical or functionally identical components, unless stated otherwise.

DETAILED DESCRIPTION

Figure 1:
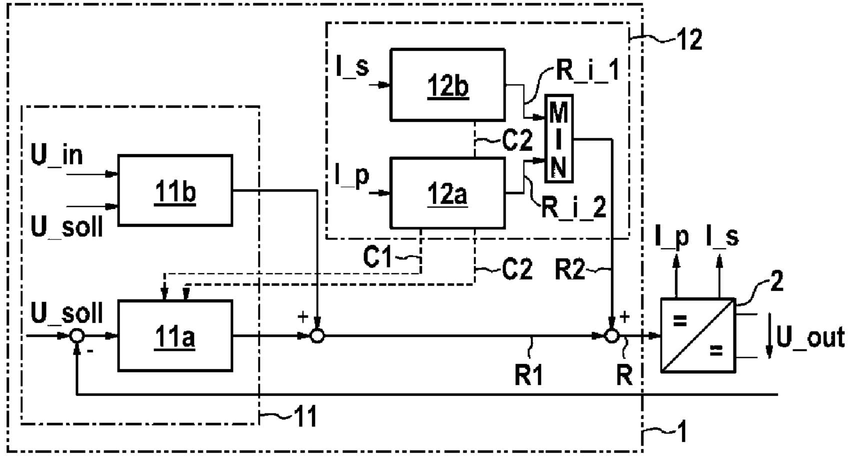
FIG. 1: a schematic view of a DC/DC converter apparatus with a control apparatus according to one embodiment.

FIG. 1 shows a schematic block diagram that forms the basis for a DC/DC converter apparatus with a control apparatus 1 and a DC/DC converter 2 according to one embodiment. The DC-DC converter 2 hereby converts the DC voltage U_in supplied at the input side into an output DC voltage U_out. Hereby a control variable R, for example in the form of a duty cycle for a pulse width modulated (PWM) actuation, can be provided to the DC/DC converter 2. The basic principle of a DC/DC converter with pulse width modulated actuation is hereby assumed to be known and will not be explained in further detail.

The control variable R for the DC/DC converter 2 can be provided, for example, by means of the control device 1. The control device 1 can comprise for this a voltage control 11 and a current control 12.

The voltage control 11 generates a first control variable R1. For this purpose, the voltage control 11 compares a value of the output DC voltage U_out to a predefined target value U_soll. For example, this target value U_soll can be a value for the target voltage to which the link capacitor 4 is to be charged. In addition to the actual voltage control 11*a*, the voltage control 11 can also comprise a further pre-control 11*b*. This pre-control 11*b* can, for example, determine a control component based on the input DC voltage U_in, the target voltage U_soll, as well as optionally also based on electrical currents at the input and/or output of the DC/DC converter 2. As shown in FIG. 1, this control component can be combined with the control component of the actual voltage control 11*a* in order to obtain the first control variable R1.

The current control 12 generates a second control variable R2, which is determined, for example, on the basis of the electric current in the DC-DC converter 2. Hereby both the primary-side current l_p at the input of the DC/DC converter 2 and the secondary-side current l_s at the output of the DC/DC converter 2 can be considered for the current regulation. For such a current regulation, two separate regulator devices 12*a* and 12*b* are provided in the current control 12.

A first regulator device 12*a* can determine a first current control variable R_i_1. This first current control variable R_i_1 is determined hereby based on the primary-side current l_p on the DC/DC converter 2. For example, this first current control variable R_i_1 can limit an electrical current at the input of the DC-DC converter 2 to a predefined maximum value. This limiting value can be adjusted, taking into account further parameters, for example the temperature in or on the DC/DC converter 2, as needed.

A second regulator device 12*b* can further determine a second current control variable R_i_2. This second current control variable R_i_2 is determined hereby on the basis of the secondary-side current l_s at the output of the DC/DC converter 2. For example, this second current control variable R_i_2 can limit an electrical current at the output of the DC/DC converter 2 to a predefined maximum value. This limiting value can also be adjusted, taking into account further parameters, for example the temperature on the DC/DC converter 2, as needed.

The current control 12 can then determine the second control variable R2 from the determined current control variables R_i_1 and R_i_2. For example, the second control variable R2 can be formed from the lower of the first current control variable R_i_1 versus the second current control variable R_i_2. In this way, it is ensured that the electrical currents in the DC/DC converter 2 do not exceed the limitation by the current control variables R_i_1 and R_i_2.

If the electric current in the DC/DC converter 2 is limited by the current control 2, this can be signaled by a corresponding signal C_1 from the first regulator device 12*a* as well as a signal C_2 from the second regulator device 12*b* on the current control 11. In that case, the regulation of the current control 11 can be appropriately adjusted or deactivated. In this way, it can be ensured that the regulation of the current control 11 does not counteract the regulation of the current control 12.

The first control variable R1 from the voltage control 11 and the second control variable R2 from the current control 12 can be combined with one another, for example added, and the result can be provided as the control variable R to the DC/DC converter 2.

For example, the DC-DC converter 2 can be a so-called flyback DC/DC converter. However, because the basic structure of such a DC-DC converter is known in particular also from flyback DC-DC converters, this will not be discussed in further detail.

Furthermore, it is also possible to arrange multiple DC-DC converters 2 in parallel in the DC-DC converter arrangement. In such a case, a separate current control 12 can be provided for each of the DC-DC converters 2, as previously described. Furthermore, a common current control 11 can be provided for the entire DC-DC converter arrangement.

Figure 2:
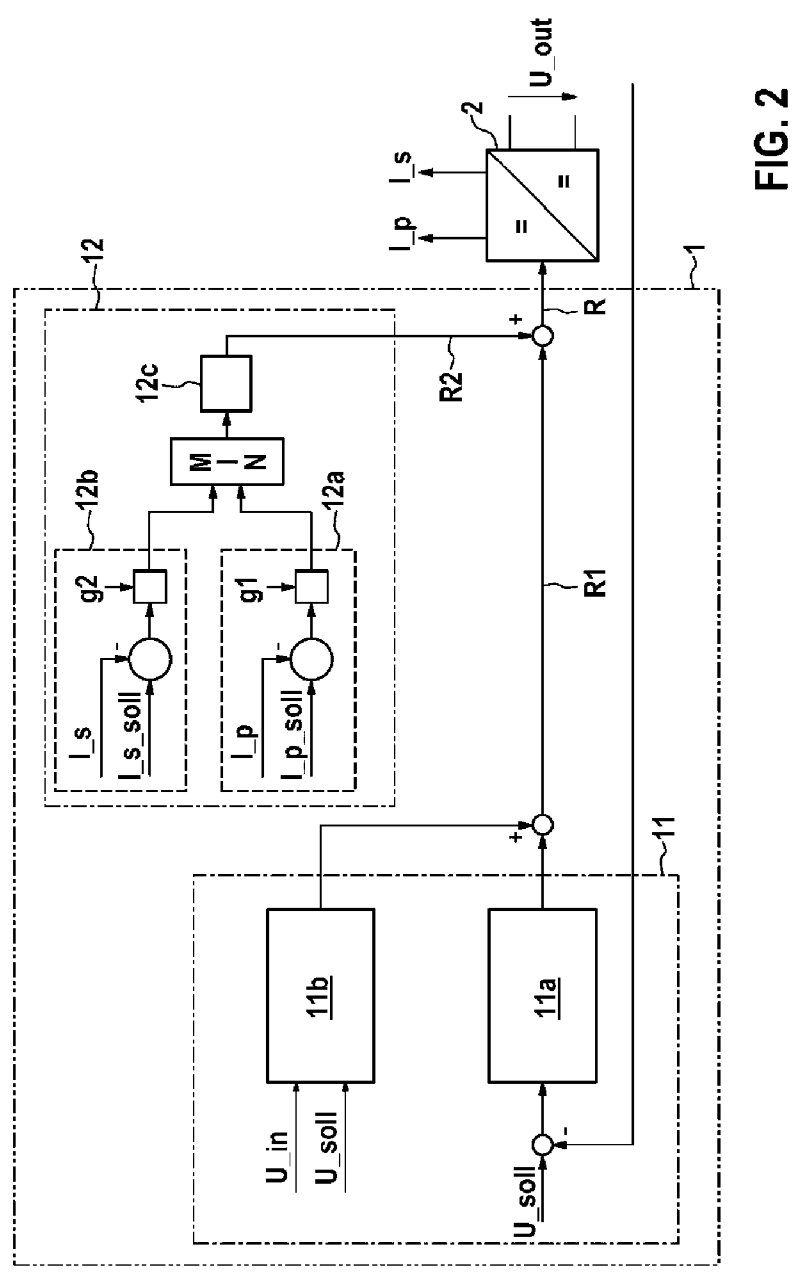
FIG. 2: a schematic view of a DC/DC converter apparatus with a control apparatus according to a further embodiment.

FIG. 2 shows a schematic block diagram that forms the basis for a DC/DC converter apparatus with a control apparatus 1 and a DC/DC converter 2 according to a further embodiment. Hereby, the statements above regarding the DC-DC converter apparatus as already described in connection with FIG. 1, basically also apply insofar as logical.

The DC/DC converter apparatus according to FIG. 2 differs from the DC/DC converter apparatus previously described in particular in that, in the first regulator device 12*a*, the primary-side current l_p is first compared to a predefined target value l_p_soll. For this purpose, a difference between the primary-side current l_p and the predefined target value l_p_soll can be formed, for example. If necessary, the result of this comparison can still be weighted with a weighting factor gl. As a starting value, the first regulator device 12*a* can provide the first current control variable R_i_1.

Analogously, in the second regulator device 12*b*, the secondary-side current l_s can be compared to a predefined target value l_s_soll. For this purpose, a difference between the secondary-side current l_s and the corresponding predefined target value l_s_soll can also be formed. If necessary, the result of this comparison can also be weighted with a weighting factor g2. The second regulator device 12*b* can provide the second current control variable R_i_2 as the output value.

Then, one of the two current control variables R_i_1 or R_i_2 can be selected from the first current control variable R_i_1 and the second current control variable R_i_2. For example, the lower of R_i_1 versus R_i_2 can be selected and provided to common control logic 12*c*. The control logic then determines the second control variable R2. This second control variable R2 can be combined with the first control variable R1, as already described in connection with FIG. 1.

Figure 3:
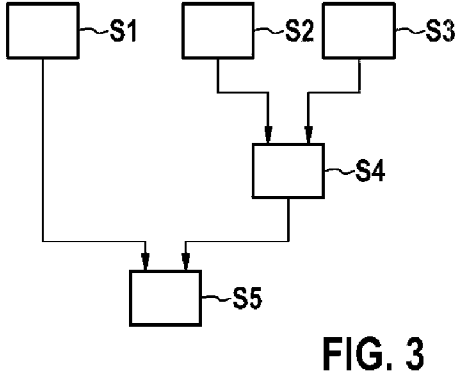
FIG. 3: a flow chart that forms the basis for a method according to one embodiment.

FIG. 3 shows a flowchart as it underlies a method for operating a DC-to-DC converter apparatus according to one embodiment. In principle, the method can comprise any of the steps previously described in connection with DC-to-DC converter apparatuses according to FIGS. 1 and 2. Analogously, the DC-DC converter apparatus described above can also comprise any desired and suitable components that are necessary for implementing the method described hereinafter.

In a first step S1, a first control variable R1 is first determined. This first control variable R2 can be determined using a target value U_soll for the output voltage of the DC/DC converter 2 and a measured value U_out for the output voltage of the DC/DC converter 2.

In step S2, a first current control variable R_i_1 is determined using an electrical current l_p at the input of the DC/DC converter 2.

In step S3, a determination of a second current control variable R_i_2 is made using an electrical current l_s at the output of the DC/DC converter 2.

Then, in step S4, a determination of a second control variable R2 for the DC/DC converter 2 is made using the first current control variable R_i_1 and the second current control variable R_i_2.

Finally, in step S5, the DC/DC converter 2 can be actuated using a combination of the first control variable R1 and the second control variable R2.

In summary, the present invention relates to a DC-DC converter arrangement with at least one DC-DC converter, wherein the DC-DC converter comprises a current regulation and a voltage regulation. For the current regulation, a first component is provided hereby for regulation based on the primary-side current at the DC/DC converter, and a second component is provided for regulation based on the secondary-side current at the DC/DC converter.

The invention claimed is:

1. A DC-DC converter apparatus, with:

a DC-DC converter (2) configured to convert an input DC voltage into an output DC voltage; and a control device (1) with:

a voltage control (11) configured to determine a first control variable (R1) for the DC/DC converter (2) using a target value (U_soll) for the output voltage of the DC/DC converter (2) and a measured value (U_out) for the output voltage of the DC/DC converter (2), and a current control (12) configured to determine a second control variable (R2) for the DC/DC converter (2);

wherein the current control (12) comprises a first regulator device (12*a*) and a second regulator device (12*b*), wherein the first regulator device (12*a*) is configured so as to determine a first current control variable (R_i_1) using an electrical current (l_p) at the input of the DC-DC converter (2), the second regulator device (12*b*) is configured so as to determine a second current control variable (R_i_2) using an electrical current (l_s) at the output of the DC/DC converter (2), and wherein the current control (12) is configured so as to determine the second control variable (R2) using the first current control variable (R_i_1) and the second current control variable (R_i_2); and wherein the control device (1) is configured so as to actuate the DC/DC converter (2) using a combination (R) of the first control variable (R1) and the second control variable (R2).

2. The DC/DC converter apparatus according to claim 1, wherein the current control (12) is configured to select as the second control variable (R2) the lower of the first current control variable (R_i_1) versus the second current control variable (R_i_2).

3. The DC-DC converter apparatus according to claim 1, wherein the first regulator device (12*a*) and the second regulator device (12*b*) of the current control (12) are in each case configured so as to output a control signal (C1, C2) if the corresponding regulator device (12*a*, 12*b*) is active in an operating mode in which a maximum current is limited in the DC-DC converter (2), and wherein the voltage control (11) is configured to adjust the first control variable (R1) using the control signal (C1, C2) from the current control (12).

4. The DC/DC converter apparatus according to claim 1, wherein the first regulator device (12*a*) is configured so as to determine the first current control variable (R_i_1) using a comparison of the electrical current (l_p) at the input of the DC/DC converter (2) with a predefined target value (l_p_soll) for the electrical current at the input of the DC/DC converter (2), the second regulator device (12*b*) is configured so as to determine the second current control variable (R_i_2) using a comparison of the electrical current (l_s) at the output of the DC-DC converter (2) with a predefined target value (l_s_soll) for the electrical current at the output of the DC-DC converter (2), and wherein the current control (12) is configured so as to determine the second control variable (R2) using the lower of the first current control variable (R_i_1) and the second current control variable (R_i_2).

5. The DC-DC converter apparatus according to claim 1, wherein the DC-DC converter apparatus comprises multiple DC-DC converters (2), wherein a separate current control (12) is provided for each DC-DC converter (2) of the DC-DC converter apparatus, and wherein a common voltage control (11) is provided for all DC-DC converters (2) of the DC-DC converter apparatus.

6. The DC-DC converter apparatus according to claim 1, wherein the DC-DC converter (2) comprises a flyback DC-DC converter.

7. The DC/DC converter apparatus according to claim 1, wherein the control device (1) is configured so as to output a duty cycle for a pulse width modulation as a control variable (R) for actuating the DC/DC converter (2).

8. A method of operating a DC-DC converter apparatus with at least one DC-DC converter (2), with the steps of:

determining (S1) a first control variable (R1) using a target value (U_soll) for the output voltage of the DC/DC converter (2) and a measured value (U_out) for the output voltage of the DC/DC converter;

determining (S2) a first current control variable (R_i_1) using an electrical current (l_p) at the input of the DC/DC converter (2);

determining (S3) a second current control variable (R_i_2) using an electrical current (l_s) at the output of the DC-DC converter (2);

determining (S4) a second control variable (R_2) for the DC/DC converter (2) using the first current control variable (R_i_1) and the second current control variable (R_i_2); and actuating (S5) the at least one DC/DC converter (2) using a combination (R) of the first control variable (R1) and the second control variable (R2).

* * * * *